United States Patent
Sun et al.

(10) Patent No.: US 9,563,301 B2
(45) Date of Patent: Feb. 7, 2017

(54) ARRAY SUBSTRATE, FABRICATING METHOD THEREOF AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Jian Sun, Beijing (CN); Lei Wang, Beijing (CN); Hailin Xue, Beijing (CN); Xiaochuan Chen, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 252 days.

(21) Appl. No.: 14/348,144

(22) PCT Filed: Jul. 17, 2013

(86) PCT No.: PCT/CN2013/079506
§ 371 (c)(1),
(2) Date: Mar. 28, 2014

(87) PCT Pub. No.: WO2014/173024
PCT Pub. Date: Oct. 30, 2014

(65) Prior Publication Data
US 2016/0132162 A1    May 12, 2016

(30) Foreign Application Priority Data
Apr. 27, 2013  (CN) .......................... 2013 1 0153116

(51) Int. Cl.
*G06F 3/041*    (2006.01)
*G06F 3/044*    (2006.01)
(Continued)

(52) U.S. Cl.
CPC .......... *G06F 3/0412* (2013.01); *G02F 1/1362* (2013.01); *G06F 3/044* (2013.01); *H01L 27/124* (2013.01);
(Continued)

(58) Field of Classification Search
CPC .................... G06F 3/0412; G06F 3/044; G06F 2203/04103; H01L 27/1262; H01L 27/124
See application file for complete search history.

(56) References Cited

U.S. PATENT DOCUMENTS 8,446,387 B2 *   5/2013  Hsu .......................... G06F 3/044
                                                                  178/18.06
8,878,814 B2 *  11/2014  Song ................... G02F 1/13338
                                                                   345/104

(Continued)

FOREIGN PATENT DOCUMENTS

CN           101295721 A      10/2008

OTHER PUBLICATIONS

Written Opinion of the International Searching Authority dated Jan. 23, 2014; PCT/CN2013/079506.

*Primary Examiner* — William Coleman
(74) *Attorney, Agent, or Firm* — Ladas & Parry LLP

(57) ABSTRACT

An array substrate, a fabricating method thereof and a display device are provided, and the array substrate comprises: a plurality of gate lines (21), extending in a first direction; a plurality of data lines (22), extending in a second direction and crossed with the plurality of gate lines (21), and the second direction being perpendicular to the first direction; a plurality of pixel units, defined by the gate lines (21) and the data lines (22) crossed with each other and arranged to be a matrix, wherein each pixel unit comprises a pixel electrode (23), a thin film transistor (24) and a common electrode (25), wherein the common electrode (25) comprises a plurality of strip-shaped electrode strips; and at (Continued)

least one first sensing line (26) and at least one second sensing line (27), and the first sensing line (26) and the second sensing line (27) being disposed in an upper layer and a lower layer respectively, the first sensing line (26) being insulated from and parallel to and overlapped with the second sensing line (27), and the first sensing line (26) and the second sensing line (27) both crossed with the electrode strips of the common electrode (25), wherein the upper layer and the lower layer are defined according to a travelling direction of light from a backlight in a depth direction of the array substrate, in the travelling direction of the light from the backlight in the depth direction of the array substrate, the first sensing line (26) is located between a pattern layer where the second sensing line (27) is located and a pattern layer where the common electrode (25) is located, and the second sensing line (27) is electrically connected with the common electrode (25).

8 Claims, 4 Drawing Sheets

(51) Int. Cl.
*G02F 1/1362* (2006.01)
*H01L 27/12* (2006.01)

(52) U.S. Cl.
CPC . *H01L 27/1262* (2013.01); *G06F 2203/04103* (2013.01)

(56) References Cited

U.S. PATENT DOCUMENTS

| | | | | |
|---|---|---|---|---|
| 9,098,134 | B2* | 8/2015 | Lee | G06F 3/041 |
| 9,110,583 | B2* | 8/2015 | Park | G06F 3/0412 |
| 2011/0181519 | A1* | 7/2011 | Tsai | G06F 3/0412 345/173 |
| 2013/0162570 | A1* | 6/2013 | Shin | G06F 3/041 345/173 |
| 2014/0160066 | A1* | 6/2014 | Kim | G06F 3/0412 345/174 |
| 2014/0168147 | A1* | 6/2014 | Huang | G06F 3/0418 345/174 |
| 2014/0176491 | A1* | 6/2014 | Zhao | G06F 3/0412 345/174 |
| 2015/0022483 | A1* | 1/2015 | Lai | G06F 3/044 345/174 |
| 2015/0234510 | A1* | 8/2015 | Chang | G06F 3/0416 345/173 |
| 2015/0234538 | A1* | 8/2015 | Xu | G06F 3/0421 345/175 |
| 2015/0324031 | A1* | 11/2015 | Jeon | G06F 3/044 345/174 |

* cited by examiner

ARRAY SUBSTRATE, FABRICATING METHOD THEREOF AND DISPLAY DEVICE

TECHNICAL FIELD

Embodiments of the present invention relate to an array substrate, a fabricating method thereof and a display device.

BACKGROUND

With the development of display technology, a touch type display device appears which integrates an input terminal and an output terminal, and with the appearance of a series of products such as a small and light handheld touch device, the demand for the touch type display device increases sharply in the market. In existing touch type display devices, a projection type capacitive touch device has became a main touch device because it can achieve a true multi-point touch and has an advantage of high sensitivity.

FIG. 1 shows a planar perspective view of an array substrate of a mutual inductance type capacitive touch display device among existing projection type capacitive touch devices, as shown in FIG. 1, the array substrate comprises a plurality of gate lines 11, a plurality of data lines 12, and the gate lines 11 are crossed with the data lines 12 to define a plurality of pixel units arranged in a matrix form, wherein each pixel unit is provided with a pixel electrode 13 and a thin film transistor (TFT) 14, the array substrate of the mutual inductance type capacitive touch display device further comprises a strip-shaped common electrode 15 and a sensing line 16 crossed with each other, the sensing line 16 and the data lines 12 are provided in the same layer. The common electrode 15 is time-division driven, and when a touch position is detected, an alternating current voltage is applied to the common electrode, and thus, a coupling capacitance is formed between the common electrode 15 and the sensing line 16. When a finger touches a display screen of a capacitive type display device, a new capacitance is generated between the finger and the common electrode 15 and the sensing line 16, and a position of a touch point can be determined by scanning a capacitance change at a crossing position of the common electrode 15 and the sensing line 16.

For the array substrate in the above touch display device, a sensing line is newly added in the array substrate which is provided in the same layer with the data line, which will cause a lowered aperture ratio of the display device. Further, to achieve the sensitivity of the touch displaying, the sensing line needs to be provided wide enough so as to form a coupling capacitance large enough between it and the common electrode, which further lowers the aperture ratio of the display device.

SUMMARY

Embodiments of the present invention provide an array substrate, a fabricating method thereof and a display device, which can improve the aperture ratio of the display device.

The array substrate according to an embodiment of the present invention, comprises: a plurality of gate lines, extending in a first direction; a plurality of data lines, extending in a second direction and crossed with the plurality of gate lines, and the second direction being perpendicular to the first direction; a plurality of pixel units, defined by the gate lines and the data lines crossed with each other and arranged to be a matrix, wherein each pixel unit comprises a pixel electrode, a thin film transistor and a common electrode, wherein the common electrode comprises a plurality of strip-shaped electrode strips; and at least one first sensing line and at least one second sensing line, and the first sensing line and the second sensing line being disposed in an upper layer and a lower layer respectively, the first sensing line being insulated from and parallel to and overlapped with the second sensing line, and the first sensing line and the second sensing line both crossed with the electrode strips of the common electrode, wherein the upper layer and the lower layer are defined according to a travelling direction of light from a backlight in a depth direction of the array substrate, in the travelling direction of the light from the backlight in the depth direction of the array substrate, the first sensing line is located between a pattern layer where the second sensing line is located and a pattern layer where the common electrode is located, and the second sensing line is electrically connected with the common electrode.

Optionally, the first sensing line and the data lines are provided in the same layer and parallel to the data lines; the second sensing line is provided in the same layer with the gate lines and does not connected with the gate lines.

Optionally, wherein the first sensing line and the gate lines are provided in the same layer and parallel to the gate lines; the second sensing line is provided in the same layer with the data lines and does not connected with the data lines.

Optionally, the strip-shaped electrode ships of the common electrode are electrically connected with each other.

A fabricating method of an array substrate according to an embodiment of the present invention, comprises: forming a metal film on a transparent substrate, forming a pattern comprising a gate electrode, a gate line and a second sensing line through a patterning process, and the gate line crossed with and being not connected with the second sensing line; sequentially forming a gate insulating layer with a through hole and a semiconductor layer on the transparent substrate with the gate electrode, the gate line and the second sensing line formed thereon; forming a metal film on the transparent substrate with the semiconductor layer formed thereon, forming a pattern comprising a source/drain electrode, a data line and a first sensing line through a patterning process, the data line being parallel to the first sensing line and the second sensing line, and the first sensing line being right above the second sensing line; sequentially forming a pixel electrode, a passivation layer with a through hole and a common electrode on the transparent substrate with the source/drain electrode, the data line and the first sensing line formed thereon, wherein the common electrode is connected with the second sensing line through the through hole of the passivation layer and the through hole of the gate insulating layer.

Another fabricating method of an array substrate according to an embodiment of the present invention, comprises: forming a metal film on a substrate, forming a pattern comprising a source/drain electrode, a data line and a second sensing line through a patterning process, and the data line crossed with the second sensing line; sequentially forming a pixel electrode, a semiconductor layer and a gate insulating layer with a through hole on the substrate with the source/drain electrode, the data line and the second sensing line formed thereon; forming a metal film on the substrate with the gate insulating layer formed thereon, forming a pattern comprising a gate electrode, a gate line and a first sensing line through a patterning process, the gate line being parallel to the first sensing line and the second sensing line, and the first sensing line being right above the second sensing line; sequentially forming a passivation layer with a through hole and a common electrode on the substrate with the gate electrode, the gate line and the first sensing line formed thereon, wherein the common electrode being connected with the second sensing line through the through hole of the passivation layer and the through hole of the gate insulating layer.

An embodiment of the present invention further provides a display device comprising the above array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

It should be noted that, in embodiments of the present invention, terms "upper layer" and "lower layer" are defined according to a travelling direction of light from a backlight in a depth direction of a display device, and in the depth direction of the display device, a layer which the light from the backlight first passes through refers to the "lower layer", and a layer which the light from the backlight passes through later refers to the "upper layer".

Figure 1:
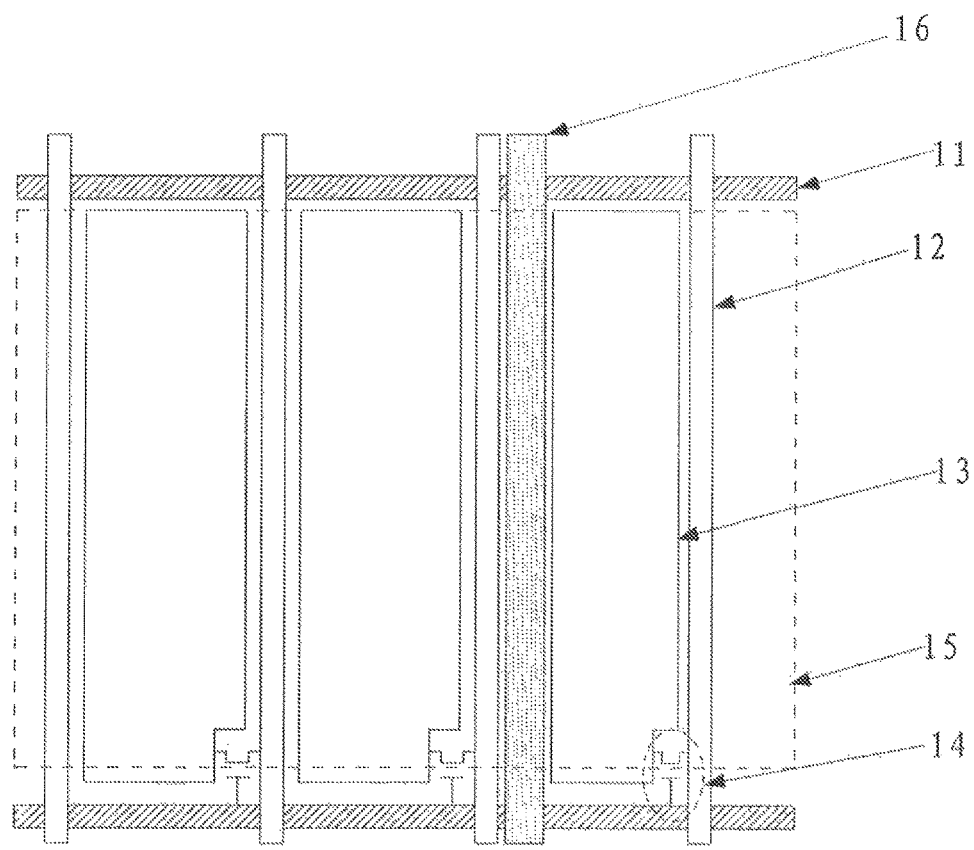
FIG. 1 is a top structural view of an array substrate in the prior art.
Figure 2:
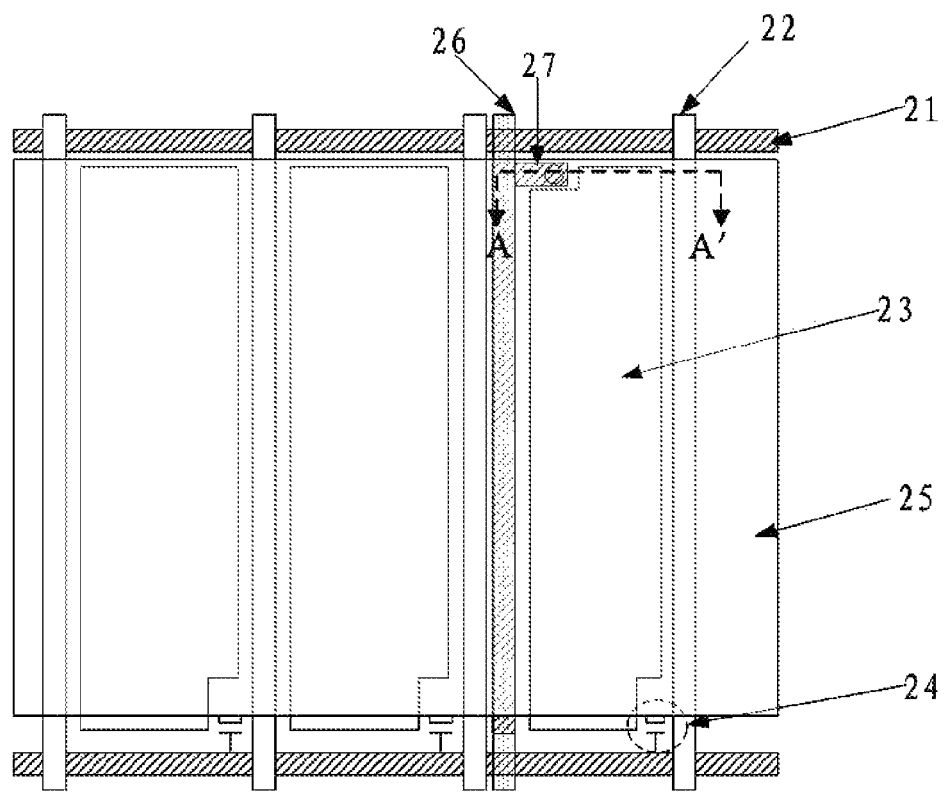
FIG. 2 is a top structural view of an array substrate provided by an embodiment of the present invention.
Figure 3:
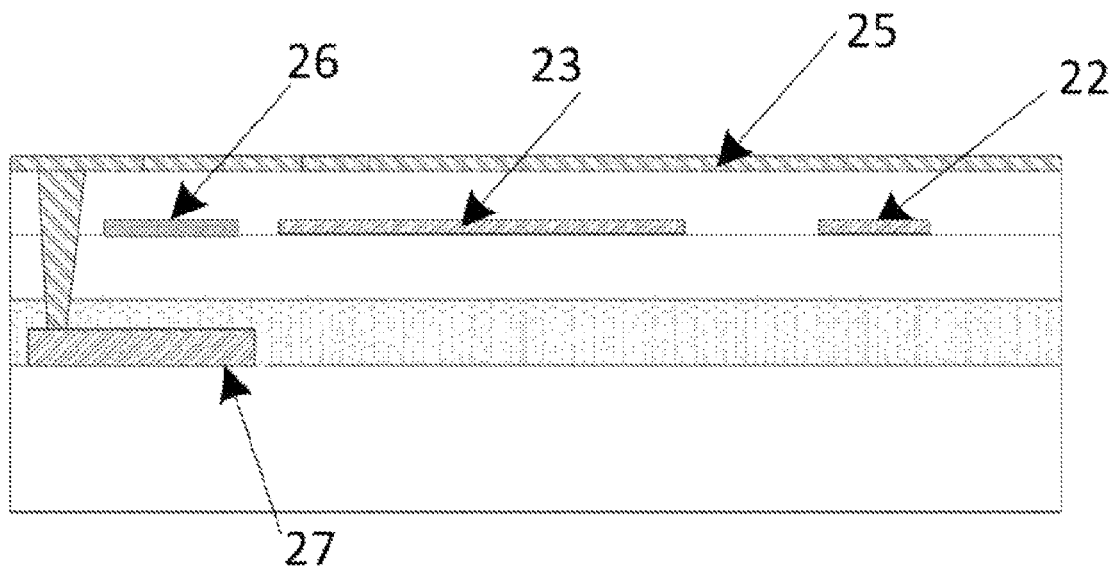
FIG. 3 is a cross-sectional view of the array substrate shown in FIG. 2 taken along line A-A'.

An embodiment of the present invention provides an array substrate, as shown in FIGS. 2 and 3, the array substrate comprises: a plurality of gate lines 21, extending in a first direction; a plurality of data lines 22, extending in a second direction and crossing with the gate lines 21, and the second direction is perpendicular to the first direction; a plurality of pixel units, defined by the plurality of gate lines 21 and the plurality of data lines 22 crossing to each other and arranged in a matrix form, wherein each pixel unit is provided with a pixel electrode 23, a thin film transistor 24 and a common electrode 25 therein. Further, the array substrate comprises a first sensing line 26 and a second sensing line 27, and the first sensing line 26 and the second sensing line 27 are disposed in an upper layer and a lower layer respectively (the upper layer and the lower layer are disposed along a travelling direction of light from a backlight in a depth direction of the array substrate), and the first sensing line is insulated from, parallel to and overlaps the second sensing line, and the first sensing line and the second sensing line both cross with the strip-shaped common electrode 25, wherein, in the travelling direction of the light from the backlight in the depth direction of the array substrate, the first sensing line 26 is located between a pattern layer where the second sensing line 27 is located and a pattern layer where the common electrode 25 is located, and the second sensing line 27 is electrically connected with the common electrode 25.

As shown in FIGS. 2 and 3, the electrode strips of the common electrode 25 cross with the first sensing line 26, and the number of the first sensing lines on the array substrate is determined by factors such as a size of the substrate and the user's touch area. The second sensing line and the first sensing line are disposed on an upper layer and a lower layer respectively, and the second sensing line corresponds to and overlaps the first sensing line, that is, a plurality of second sensing lines are provided below each first sensing line, and the number of the pixel units in an extending direction of the first sensing line is the number of the second sensing lines under each first sensing line. In the embodiment of the present invention, a touch position is determined by crossing the common electrode and the first sensing lines, and the electrode strip and the sensing line having a capacitance change are determined by measuring the capacitance change between the electrode strips of the common electrode and the first sensing lines, and a crossing position of the electrode strip and the sensing line having the capacitance change is the touch position.

Figure 4:
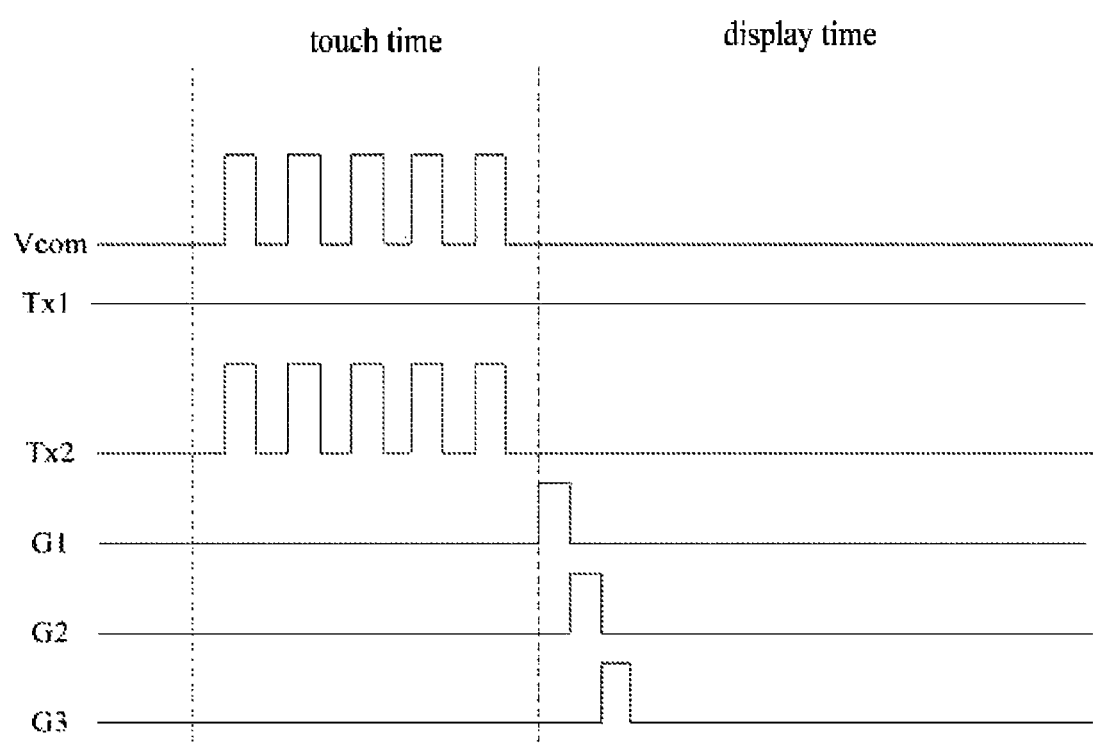
FIG. 4 is a schematic view of a drive signal for the array substrate provided by the embodiment of the present invention.

In embodiments of the present invention, the common electrode is time-division driven. Exemplarily, a time of displaying each frame of image is divided into a display time and a touch time, as shown in FIG. 4, during the display time, a voltage Vcom applied to the common electrode is a direct current voltage, optionally, the Vcom can be 0, of course, the Vcom can also be an alternating current voltage and is not limited herein. The gate lines are sequentially applied drive voltages G1, G2, G3 . . . , and a display device displays an image. During the touch time, the drive voltage signal Vcom applied to the common electrode is an actuating signal, the second sensing line is electrically connected with the common electrode, at this moment, a voltage signal Tx2 applied to the second sensing line is also an actuating signal, a voltage signal Tx1 applied to the first sensing line is a direct current signal, and alternatively, the direct current voltage applied to the first sensing line is 0. Thus, when the common electrode is driven during the touch time, besides a coupling capacitor C1 generated between the common electrode and the first sensing line, a coupling capacitor C2 is also generated between the second sensing line and the first sensing line, and C1 and C2 are in parallel connection, and thereby, a region of the first sensing line at a crossing position is used twice and two coupling capacitors are generated.

When the user touches the display device, a coupling between the common electrode and the sensing line at a touch position is affected, thus a capacitance value at the touch position is changed. When the capacitance is measured, all of the electrode strips of the common electrode are applied the actuating signal, all of the first sensing lines and all of the electrode strips of the common electrode are connected to a measuring circuit, thus, the capacitance at the crossing point of the common electrode and the first sensing lines can be measured, then whether the capacitance at the crossing point changes is determined, and the crossing point where capacitance value changes is the touch position.

For the array substrate provided by the embodiment of the present invention, by additionally provided the second sensing line which is disposed on a different layer with the first sensing line, corresponds to and overlaps the first sensing line, and electrically connected with the common electrode, a coupling capacitor is also generated between the second sensing line and the first sensing line, and thus, a parallel connection of the capacitors is achieved, and the region of the first sensing line at the crossing position of the first sensing line and the electrode strip of the common electrode is used twice. Thus, compared with a current array substrate only comprising the first sensing line, under the same sensitivity, the area of the first sensing line in the embodiment of the present invention is half of the prior art, and the added second sensing line nearly overlaps the first sensing line completely, and a part of the second sensing line extended out of the first sensing line can be omitted. Therefore, an aperture ratio of the display device comprising the array substrate according to the embodiment of the present invention can be improved.

Optionally, when the array substrate is in a bottom gate structure, as shown in FIGS. 2 and 3, the first sensing line 26 is provided at the same layer with and parallel to the data lines 22; the second sensing line 27 is provided at the same layer with and is not connected with the gate lines 21.

At this moment, the electrode strips of the common electrode 25 cross with the data lines 22, the first sensing line 26 is right above the second sensing line 27 (along the travelling direction of the light from the backlight in the depth direction of the array substrate), and the first sensing line is parallel to, corresponds to, overlaps and is insulated from the second sensing line. Both of the first sensing line 26 and the second sensing line 27 are parallel to the data lines and cross with the electrode strips of the common electrode. Herein, the first sensing line 26 and the data lines 22 are provided at the same layer, the second sensing line 27 and the gate line 21 are provided at the same layer, thus, the array substrate provided by the embodiment of the present invention can be fabricated without increasing the number of patterning processes.

In the embodiment of the present invention, providing at the same layer refers to at least two patterns: providing at least two patterns at the same layer refers to forming the at least two patterns by using one film through a patterning process. For example, providing the data lines and the first sensing line at the same layer refers to forming the data lines and the first sensing line from the same metal film through a patterning process.

Figure 5:
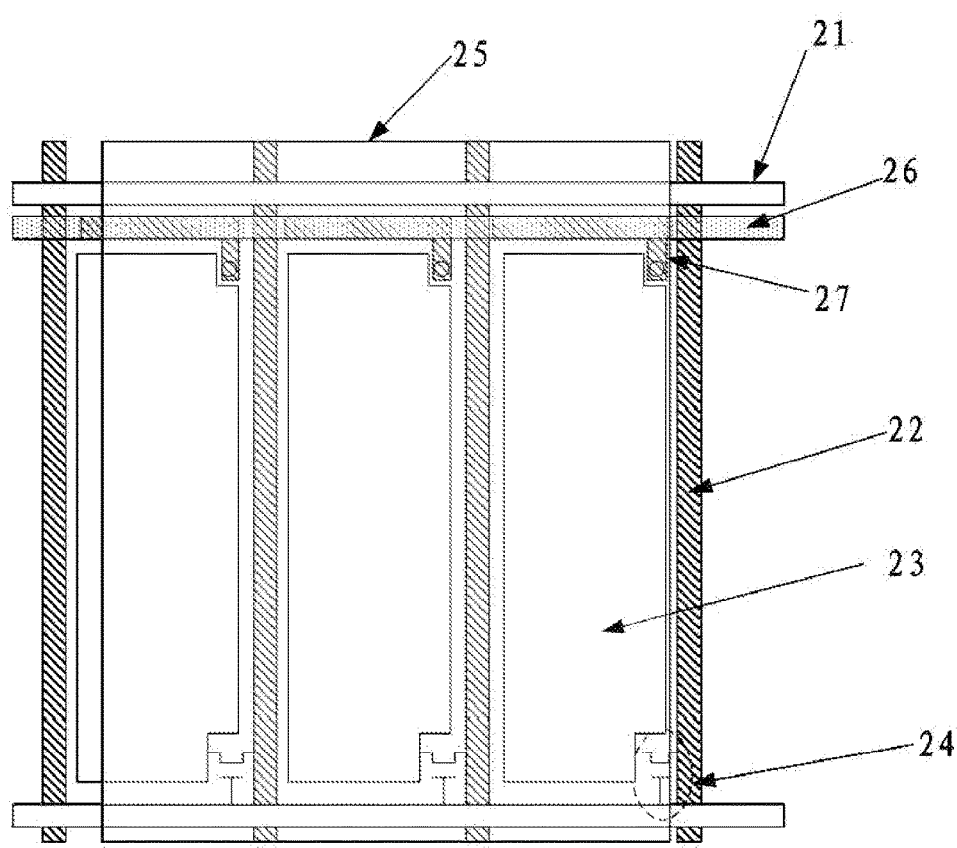
FIG. 5 is a top structural view of another array substrate provided by an embodiment of the present invention.

Optionally, when the array substrate is in a top gate structure, as shown in FIG. 5, the first sensing line 26 is provided at the same layer with and parallel to the gate lines 21; the second sensing line 27 is provided at the same layer with and is not connected with the data lines 22.

At this moment, the electrode strips of the common electrode 25 cross with the gate lines 21, the first sensing line 26 is right above the second sensing line 27 (along the travelling direction of the light from the backlight in the depth direction of the array substrate), and the first sensing line is parallel to, corresponds to, overlaps and is insulated from the second sensing line. Both of the first sensing line 26 and the second sensing line 27 are parallel to the gate lines 21 and cross with the electrode strips of the common electrode 25. The first sensing line 26 and the gate lines 21 are provided at the same layer, the second sensing line 27 and the data lines 22 are provided at the same layer, thus, the array substrate provided by the embodiment of the present invention can be fabricated without increasing the number of patterning processes.

Of course, in the array substrates of FIGS. 2 and 5, the common electrode is located above the first sensing line and the second sensing line (along the travelling direction of the light from the backlight in the depth direction of the array substrate), when the common electrode is located at the lowermost layer, the first sensing line is still located between a pattern layer where the second sensing line is located and a pattern layer where the common electrode is located, and the second sensing line is located above the first sensing line and is electrically connected with the common electrode. Please refer to FIG. 2 or 5 for the specific structure which is not detailed herein.

An embodiment of the present invention further provides a fabricating method of an array substrate, a structure of the array substrate is shown in FIG. 2, and the method comprises:

S1, forming a metal film on a transparent substrate, forming a pattern comprising a gate electrode, a gate line 21 and a second sensing line 27 through a patterning process, and the gate line 21 crosses with and is not electrically connected with the second sensing line 27, i.e., being insulative.

S2, sequentially fabricating a gate insulating layer with a through hole and a semiconductor layer (not shown in the drawing) on the transparent substrate with the gate electrode, the gate line and the second sensing line formed thereon.

S3, forming a metal film on the transparent substrate with the semiconductor layer formed thereon, forming a pattern comprising a source/drain electrode, a data line 22 and a first sensing line 26 through a patterning process, the data line 22 is parallel to the first sensing line 26, and the first sensing line 26 is right above the second sensing line 27.

S4, sequentially fabricating a pixel electrode 23, a passivation layer with a through hole and a common electrode 25 on the transparent substrate with the source/drain electrode, the data line 22 and the first sensing line 26 formed thereon; the common electrode 25 is connected with the second sensing line 27 through the through hole of the passivation layer and the through hole of the gate insulating layer.

An embodiment of the present invention further provide a fabricating method of an array substrate, a structure of the array substrate is shown in FIG. 5, and the method comprises:

S1, forming a metal film on a substrate, forming a pattern comprising a source/drain electrode, a data line 22 and a second sensing line 27 through a patterning process, and the data line 22 crosses with the second sensing line 27.

S2, sequentially fabricating a pixel electrode 23, a semiconductor layer and a gate insulating layer with a through hole on the substrate with the source/drain electrode, the data line 22 and the second sensing line 27 formed thereon.

S3, forming a metal film on the substrate with the gate insulating layer formed thereon, forming a pattern comprising a gate electrode, a gate line 21 and a first sensing line 26 through a patterning process, the gate line 21 is parallel to the first sensing line 26, and the first sensing line 26 is right above the second sensing line 27.

S4, sequentially fabricating a passivation layer with a through hole and a common electrode 25 on the substrate with the gate electrode, the gate line 21 and the first sensing line 26 formed thereon; the common electrode 25 is connected with the second sensing line 27 through the through hole of the passivation layer and the through hole of the gate insulating layer.

An embodiment of the present invention further provides a display device comprising the above array substrate.

An example of the display device is liquid crystal display device, wherein an array substrate and an opposite substrate are disposed to face each other to form a liquid crystal cell, and a liquid crystal material is filled in the liquid crystal cell. The opposite substrate is a color filter substrate, for example. A pixel electrode of each pixel unit of the array substrate is used to apply an electric field, so as to control a rotation of the liquid crystal material and to perform a displaying operation. In some examples, the liquid crystal display device further comprises a backlight source provided for the array substrate.

Another example of the display device is an organic light emitting display (OLED) device, wherein a pixel electrode of each pixel unit of an array substrate is used as an anode or a cathode to drive an organic light-emitting material to emit light so as to perform a displaying operation.

Exemplarily, the display device according to the embodiments of the present invention can be applied to a product with a touch display function such as a television, a digital camera, a mobile phone, a tablet computer or an electronic paper.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. An array substrate, comprising:
a plurality of gate lines, extending in a first direction;
a plurality of data lines, extending in a second direction and crossed with the plurality of gate lines, and the second direction being perpendicular to the first direction;
a plurality of pixel units, defined by the gate lines and the data lines crossed with each other and arranged to be a matrix, wherein each pixel unit comprises a pixel electrode, a thin film transistor and a common electrode, wherein the common electrode comprises a plurality of strip-shaped electrode strips; and
at least one first sensing line and at least one second sensing line, and the first sensing line and the second sensing line being disposed in an upper layer and a lower layer respectively, the first sensing line being insulated from and parallel to and overlapped with the second sensing line, and the first sensing line and the second sensing line both crossed with the electrode strips of the common electrode,
wherein the upper layer and the lower layer are defined according to a travelling direction of light from a backlight in a depth direction of the array substrate, in the travelling direction of the light from the backlight in the depth direction of the array substrate, the first sensing line is located between a pattern layer where the second sensing line is located and a pattern layer where the common electrode is located, and the second sensing line is electrically connected with the common electrode,
wherein the first sensing line and the common electrode are located in different layers.

2. The array substrate according to claim 1, wherein the first sensing line and the data lines are provided in the same layer and parallel to the data lines;
the second sensing line is provided in the same layer with the gate lines and does not connected with the gate lines.

3. The array substrate according to claim 1, wherein the first sensing line and the gate lines are provided in the same layer and parallel to the gate lines;
the second sensing line is provided in the same layer with the data lines and does not connected with the data lines.

4. The array substrate according to claim 1, wherein the strip-shaped electrode ships of the common electrode are electrically connected with each other.

5. The array substrate according to claim 1, wherein there are a plurality of the first sensing line.

6. The array substrate according to claim 1, wherein the number of the second sensing lines is equal to the number of the pixel units in an extending direction of the first sensing lines.

7. A fabricating method of an array substrate, comprising:
forming a metal film on a transparent substrate, forming a pattern comprising a gate electrode, a gate line and a second sensing line through a patterning process, and the gate line crossed with and being not connected with the second sensing line;
sequentially forming a gate insulating layer with a through hole and a semiconductor layer on the transparent substrate with the gate electrode, the gate line and the second sensing line formed thereon;
forming a metal film on the transparent substrate with the semiconductor layer formed thereon, forming a pattern comprising a source/drain electrode, a data line and a first sensing line through a patterning process, the data line being parallel to the first sensing line and the second sensing line, and the first sensing line being right above the second sensing line;
sequentially forming a pixel electrode, a passivation layer with a through hole and a common electrode on the transparent substrate with the source/drain electrode, the data line and the first sensing line formed thereon,
wherein the common electrode is connected with the second sensing line through the through hole of the passivation layer and the through hole of the gate insulating layer.

8. A fabricating method of an array substrate, comprising:
forming a metal film on a substrate, forming a pattern comprising a source/drain electrode, a data line and a second sensing line through a patterning process, and the data line crossed with the second sensing line;
sequentially forming a pixel electrode, a semiconductor layer and a gate insulating layer with a through hole on the substrate with the source/drain electrode, the data line and the second sensing line formed thereon;
forming a metal film on the substrate with the gate insulating layer formed thereon, forming a pattern comprising a gate electrode, a gate line and a first sensing line through a patterning process, the gate line being parallel to the first sensing line and the second sensing line, and the first sensing line being right above the second sensing line;
sequentially forming a passivation layer with a through hole and a common electrode on the substrate with the gate electrode, the gate line and the first sensing line formed thereon,
wherein the common electrode being connected with the second sensing line through the through hole of the passivation layer and the through hole of the gate insulating layer.

* * * * *